(12) United States Patent
Verhaverbeke et al.

(10) Patent No.: US 8,852,962 B2
(45) Date of Patent: Oct. 7, 2014

(54) APPARATUS AND METHODS FOR SILICON OXIDE CVD RESIST PLANARIZATION

(71) Applicant: Applied Materials, Inc., Santa Clara, CA (US)

(72) Inventors: Steven Verhaverbeke, San Francisco, CA (US); Roman Gouk, San Jose, CA (US); Li-Qun Xia, Cupertino, CA (US); Mei-yee Shek, Palo Alto, CA (US); Yu Jin, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/659,555

(22) Filed: Oct. 24, 2012

(65) Prior Publication Data

US 2013/0130405 A1 May 23, 2013

Related U.S. Application Data

(60) Provisional application No. 61/563,137, filed on Nov. 23, 2011.

(51) Int. Cl.

| | | |
|---|---|---|
| H01L 21/02 | (2006.01) | |
| G11B 5/74 | (2006.01) | |
| G11B 5/84 | (2006.01) | |
| H01L 21/67 | (2006.01) | |
| H01L 21/677 | (2006.01) | |
| H01L 21/033 | (2006.01) | |
| H01F 41/34 | (2006.01) | |

(52) U.S. Cl.
CPC ............... *H01F 41/34* (2013.01); *G11B 5/743* (2013.01); *G11B 5/84* (2013.01); *H01L 21/67161* (2013.01); *H01L 21/67736* (2013.01); *H01L 21/0332* (2013.01)
USPC ................................ 438/3; 438/736; 438/738

(58) Field of Classification Search
CPC .......... H01F 41/34; G11B 5/84; G11B 5/743; G11B 5/855; H01L 21/0332; H01L 21/0337; H01L 21/31144
USPC ....................... 438/3, 736, 738; 430/313, 314
See application file for complete search history.

(56) References Cited

U.S. PATENT DOCUMENTS

| | | |
|---|---|---|
| 3,967,002 A | 6/1976 | Almasi et al. |
| 4,314,894 A | 2/1982 | Schmelzer et al. |
| 4,556,597 A | 12/1985 | Best et al. |
| 4,669,004 A | 5/1987 | Moon et al. |
| 4,684,547 A | 8/1987 | DiStefano et al. |
| 4,935,278 A | 6/1990 | Krounbi et al. |
| 5,220,476 A | 6/1993 | Godwin et al. |

(Continued)

OTHER PUBLICATIONS

International Search Report and Written Opinion for PCT/US2012/056617 dated Dec. 26, 2012.

(Continued)

*Primary Examiner* — Michael Trinh
(74) *Attorney, Agent, or Firm* — Patterson & Sheridan, LLP

(57) ABSTRACT

Embodiments of the present invention provide methods and apparatus for forming a patterned magnetic layer for use in magnetic media. According to embodiments of the present application, a silicon oxide layer formed by low temperature chemical vapor deposition is used to form a pattern in a hard mask layer, and the patterned hard mask is used to form a patterned magnetic layer by plasma ion implantation.

20 Claims, 5 Drawing Sheets

(56) References Cited

U.S. PATENT DOCUMENTS

| | | | |
|---|---|---|---|
| 5,232,566 A | 8/1993 | Edmonson et al. | |
| 5,723,033 A | 3/1998 | Weiss | |
| 5,858,474 A | 1/1999 | Meyer et al. | |
| 5,991,104 A | 11/1999 | Bonyhard | |
| 6,014,296 A | 1/2000 | Ichihara et al. | |
| 6,055,139 A | 4/2000 | Ohtsuka et al. | |
| 6,086,961 A | 7/2000 | Bonyhard | |
| 6,168,845 B1 | 1/2001 | Fontana, Jr. et al. | |
| 6,368,425 B1 | 4/2002 | Segar et al. | |
| 6,368,678 B1 | 4/2002 | Bluck et al. | |
| 6,383,574 B1 | 5/2002 | Han et al. | |
| 6,510,015 B2 | 1/2003 | Sacks et al. | |
| 6,656,614 B1 | 12/2003 | Li et al. | |
| 6,749,907 B2 | 6/2004 | Heckmeier et al. | |
| 6,753,043 B1 | 6/2004 | Kuo et al. | |
| 6,864,042 B1 | 3/2005 | Kuo et al. | |
| 6,898,031 B1 | 5/2005 | Belser et al. | |
| 6,987,272 B2 | 1/2006 | Ota et al. | |
| 7,033,444 B1 | 4/2006 | Komino et al. | |
| 7,038,225 B2 | 5/2006 | Kuo et al. | |
| 7,050,248 B1 | 5/2006 | Wang | |
| 7,394,202 B2 | 7/2008 | Horsky et al. | |
| 7,408,729 B2 | 8/2008 | Brooks et al. | |
| 7,465,478 B2 | 12/2008 | Collins et al. | |
| 7,479,643 B2 | 1/2009 | Horsky | |
| 7,670,529 B2 | 3/2010 | Choi et al. | |
| 7,675,048 B2 | 3/2010 | Binns et al. | |
| 7,824,497 B2 | 11/2010 | Watanabe et al. | |
| 2005/0271819 A1* | 12/2005 | Wago et al. | 427/259 |
| 2006/0002053 A1 | 1/2006 | Brown et al. | |
| 2007/0049032 A1* | 3/2007 | Abatchev et al. | 438/691 |
| 2007/0144442 A1 | 6/2007 | Migita | |
| 2008/0076268 A1 | 3/2008 | Kraus et al. | |
| 2008/0093336 A1 | 4/2008 | Lee et al. | |
| 2009/0163042 A1 | 6/2009 | Tseng et al. | |
| 2009/0239100 A1 | 9/2009 | Watanabe | |
| 2010/0047625 A1* | 2/2010 | Kamata et al. | 428/800 |
| 2010/0053813 A1 | 3/2010 | Fukushima et al. | |
| 2010/0165504 A1 | 7/2010 | Fukushima et al. | |
| 2010/0221583 A1 | 9/2010 | Foad et al. | |
| 2010/0327413 A1* | 12/2010 | Lee et al. | 257/618 |
| 2011/0143170 A1 | 6/2011 | Gouk et al. | |
| 2011/0163065 A1 | 7/2011 | Verhaverbeke et al. | |

OTHER PUBLICATIONS

Lohau, et al. "Effect of Ion Beam Patterning on the Write and Read Performance of Perpendicular Granular Recording Media," IEEE Transactions on Magnetics vol. 37, No. 4 (Jul. 2001), pp. 1652-1656.
Irene Hu "Nanoscale Focused Ion Beam Patterning and Characterization of Perpendicular Magnetic Recording media" NNIN REU 2006 Research Accomplishment, pp. 122-123.
International Search Report and Written Opinion for PCT/US2010/024163 dated Sep. 15, 2010.
International Search Report and Written Opinion for PCT/US2012/060430 dated Jan. 3, 2013.

* cited by examiner

US 8,852,962 B2

APPARATUS AND METHODS FOR SILICON OXIDE CVD RESIST PLANARIZATION

CROSS-REFERENCE TO RELATED APPLICATIONS

This application claims benefit of U.S. Provisional Patent Application Ser. No. 61/563,137,filed Nov. 23, 2011,which is herein incorporated by reference.

BACKGROUND OF THE INVENTION

1. Field of the Invention

Embodiments of the present invention generally relate to apparatus and methods for manufacturing magnetic media. More specifically, embodiments of the present invention relate to apparatus and methods for patterning magnetically susceptible layers on magnetic media.

2. Description of the Related Art

Magnetic media are used in various electronic devices such as hard disk drives (HDD) and magnetoresistive random access memory (MRAM) devices. Magnetic media devices store and retrieve information using magnetic domains. A hard-disk drive generally includes magnetic media in the form of disks having magnetic domains that are separately addressable by a magnetic head. The magnetic head moves into proximity with a magnetic domain and alters the magnetic properties of the magnetic domain to record information. To recover the recorded information, the magnetic head moves into proximity with the magnetic domain and detects the magnetic properties of the magnetic domain. The magnetic properties of the magnetic domain are generally interpreted as corresponding to one of two possible states, the "0" state and the "1" state. In this way, digital information may be recorded on magnetic media and recovered thereafter.

Magnetic media typically comprise a non-magnetic glass, composite glass/ceramic, or metal substrate with magnetically susceptible layers formed thereon. The magnetically susceptible layer is generally patterned such that the surfaces of the magnetic media have areas of magnetic susceptibility interspersed with areas of magnetic inactivity.

Traditionally, the magnetically susceptible layer is patterned by imprinting a photoresist layer to form a pattern over the magnetically susceptible layer and implanting the magnetically susceptible layer with the imprinted photoresist layer acting as a mask. However, there are several problems with this traditional approach. Because imprinting the photoresist layer aims to leave small pillars of photoresist to form the pattern, upon lifting off the imprint die, small pillars of the photoresist are sometime erroneously removed with the imprint die, thus, creating defects. The photoresist suitable for pattern imprinting is typically a weak polymer that may be damaged by subsequent processing conditions. Additionally, because the imprinting process limits the thickness of the photoresist, photoresist of greater thickness for withstanding subsequent processing conditions cannot be used.

Therefore, there is a need to improve the patterning process in magnetic media manufacturing.

SUMMARY OF THE INVENTION

Embodiments of the present invention generally relate to apparatus and methods for forming a patterned magnetic layer.

One embodiment of the present invention provides a method for forming a patterned magnetic layer. The method comprises forming a pattern in a hard mask layer deposited over a magnetically susceptible layer on a substrate, and directing energy towards the substrate to modify a magnetic property of the magnetically susceptible layer to form a patterned magnetic layer.

One embodiment of the present invention provides a method for forming a patterned magnetic layer. The method comprises forming a patterned photoresist layer on a substrate having a magnetically susceptible layer and a hard mask layer over the magnetically susceptible layer, depositing a silicon oxide layer by chemical vapor deposition over the patterned photoresist layer to fill vias within the patterned photoresist layer, and etching back the silicon oxide layer to reveal the photoresist layer. The method further comprises removing the photoresist layer to form a pattern of the silicon oxide layer, etching the hard mask layer using the pattern of the silicon oxide layer, and directing energy towards the substrate to modify a magnetic property of the magnetically susceptible layer to form the patterned magnetic layer.

Another embodiment of the present invention provides a system for forming a patterned magnetic layer. The system comprises a first tool comprising at least one of a chemical vapor deposition chamber and an etch chamber and a second tool comprising one or more plasma ion immersion implantation chambers. The system further comprises a substrate flipping tool configured to flip substrates, and a track assembly having a robot for transferring substrates among the first tool, the second tool, and the substrate flipping tool.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention provide methods and apparatus for forming a patterned magnetic layer for magnetic media. According to embodiments of the present application, a silicon oxide layer is used to form a patterned hard mask layer, and the patterned hard mask layer is used to pattern a magnetically susceptible layer by plasma implantation. Particularly, a negative image of the intended pattern is first formed using a photoresist layer over a hard mask layer that is deposited on the magnetically susceptible layer. The negative image may be formed by a traditional approach, such as imprinting. A silicon oxide layer is then deposited over the patterned photoresist layer filling vias in the photoresist layer. The silicon oxide layer is formed by a low temperature process, such as a chemical vapor deposition (CVD) process, to avoid damaging the photoresist layer and the magnetically susceptible layer. The silicon oxide layer is then etched back to expose the photoresist layer. The photoresist layer is then removed leaving a pattern of silicon oxide over the hard mask layer. The hard mask layer is etched using the patterned silicon oxide functioning as a mask. The magnetically susceptible layer is then patterned under the pattern of the hard mask layer and silicon oxide layer.

Figure 1:
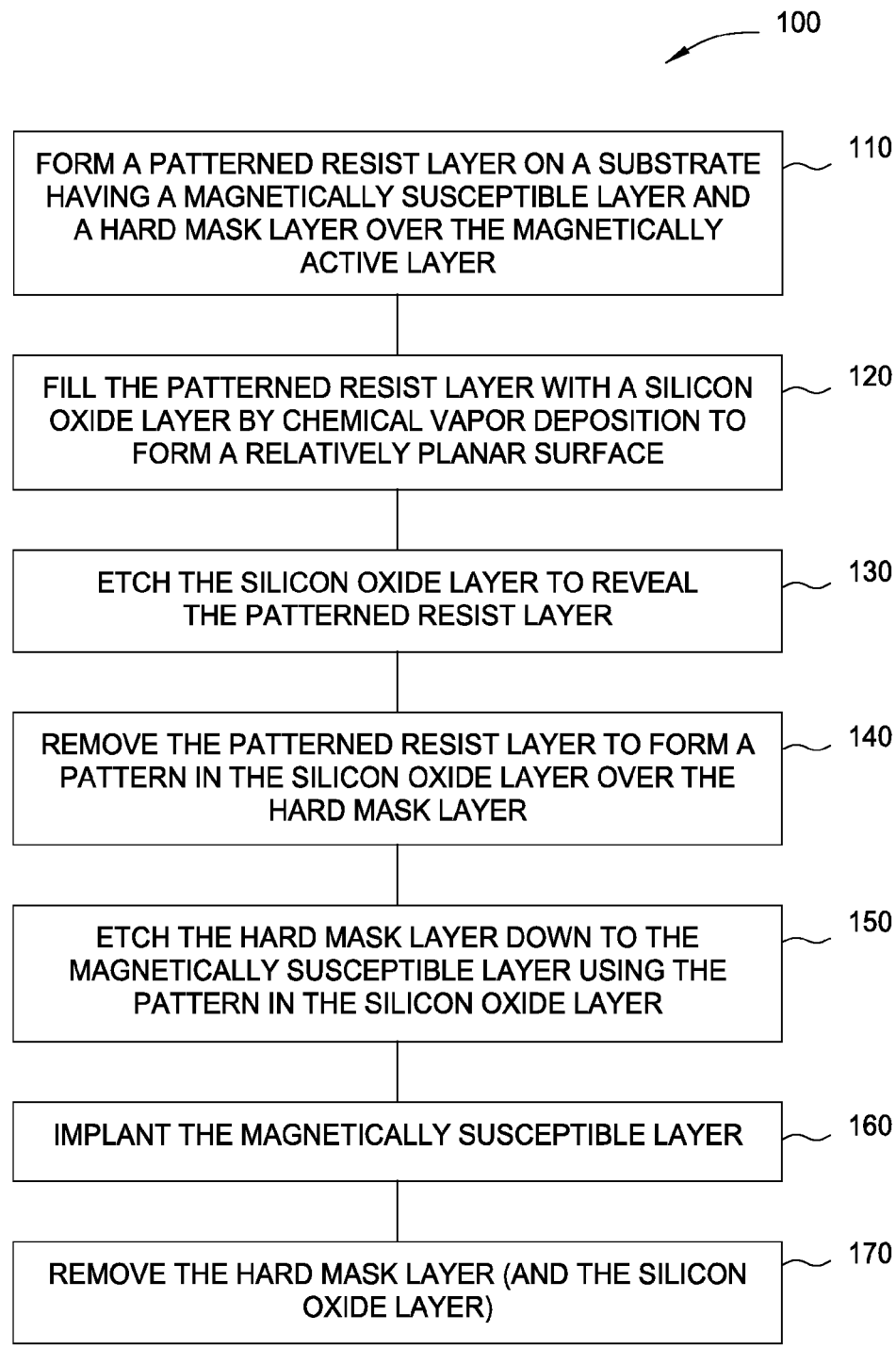
FIG. 1 is a flow diagram of one method for forming a patterned magnetic layer according to one embodiment of the present invention.

FIG. 1 is a flow diagram summarizing a method 100 for forming a patterned magnetic layer according to one embodiment of the present invention. According to the method 100, a silicon oxide is patterned through a negative image formed by a photoresist layer and used to pattern a hard mask for forming a patterned magnetic layer.

In box 110, a patterned photoresist layer is formed on a substrate having a magnetically susceptible layer and a hard mask layer formed over the magnetically susceptible layer. The substrate generally includes a base layer of structurally strong material, such as metal, glass, ceramic, or combinations thereof. For magnetic media, substrates that are magnetically impermeable or only very weak paramagnetic properties and with good adhesion to a magnetically susceptible layer are commonly used, for example substrates of aluminum, glass or carbon composite.

The magnetically susceptible layer may be formed from one or more ferromagnetic materials. The magnetically susceptible material may be formed in multiple layers, each layer having the same or different composition. The magnetically susceptible layer may comprise one or more elements selected from the group consisting of cobalt, platinum, nickel, molybdenum, chromium, tantalum, iron, terbium, and gadolinium. The magnetically susceptible layer may be formed by any suitable method, such as physical vapor deposition, or sputtering, chemical vapor deposition, plasma-enhanced chemical vapor deposition, spin-coating, plating by electrochemical or electroless means, and the like.

The hard mask layer formed over the magnetically susceptible layer may be a carbon film formed at low temperatures, such as a temperature lower under 150° C., so that the magnetically susceptible layer is not damaged during the formation of the hard mask layer.

The photoresist layer may comprise a curable material, such as an epoxy or thermoplastic polymer, that will flow prior to being cured and will provide protection to underlying layers during patterning processes after curing. The photoresist layer may be formed by a spin-on method. The photoresist layer is patterned by physical imprint with a template. Alternately, the photoresist layer may be patterned using any process suitable for forming small features, such as electron beam, ion beam or molecular beam writing.

The pattern formed in the photoresist material generally results in portions of the hard mask layer covered by a thin layer of photoresist material, or no photoresist material, and other portions covered by a thick layer of photoresist material. The thick photoresist layer may have a thickness between about 50 nm and about 150 nm, such as between about 60 nm and about 100 nm, for example about 80 nm. The pattern in the photoresist layer is a negative image of an intended pattern for using on the magnetically susceptible layer. The negative image is less susceptible to damages than the intended pattern because instead of having columns of photoresist remaining, the patterned photoresist layer has columns of photoresist removed.

In box 120, a silicon oxide layer is deposited and filled in the patterned photoresist layer. The silicon oxide layer is formed by a low temperature deposition method to avoid thermal damage to the magnetically susceptible layer and the patterned photoresist layer. Low temperature chemical vapor deposition (CVD) may be used to form the silicon oxide layer. The silicon oxide layer is generally formed at a temperature less than about 150° C., such as between about 20° C. and about 100° C., or between about 30° C. and about 80° C., for example about 70° C. The silicon oxide layer may be formed using a PRODUCER® CVD or atomic layer deposition (ALD) chamber, or a plasma ion immersion implantation (P3i) chamber, available from Applied Materials, Inc.

During the CVD process, a silicon containing precursor is flown to a processing chamber to deposit a silicon containing half-layer conformally on the substrate, covering the patterned photoresist layer in the masked areas and the unmasked areas, including vertical and horizontal surfaces of the patterned photoresist layer. A reactive oxygen containing gas is then introduced into the processing chamber and reacts with the silicon containing half-layer to produce a conformal silicon oxide layer. The silicon containing precursor and the reactive oxygen containing gas may be flown to the processing chamber cyclically to form the silicon oxide layer in multiple thin layers to avoid forming voids.

Suitable precursors for deposition of the silicon oxide layer include those that may be maintained in the vapor phase at the low temperatures described above and at the low pressure for CVD processes. Precursors susceptible to being activated using a remote plasma are also suitable.

Bis(diethylamino)silane (BDEAS) may be used as silicon containing precursor for forming the silicon oxide layer. BDEAS may be introduced into the chamber at a flow rate of between about 5 sccm and about 1000 sccm. An optional carrier gas, e.g., helium, may be introduced into the chamber at a flow rate of between about 100 sccm and about 20000 sccm. The ratio of the flow rate of BDEAS, to the flow rate of helium, into the chamber is about 1:1 or greater, such as between about 1:1 and about 1:100.The chamber pressure may be greater than about 5 mTorr, such as between about 1.8 Torr and about 100 Torr, and the temperature of a substrate support in the processing chamber may be between about 10° C. and about 100° C. while BDEAS is flown into the chamber to deposit the silicon oxide layer. More particularly, the temperature is between about 30° C. and about 80° C. BDEAS may be flown into the chamber for a period of time sufficient to deposit a layer having a thickness of between about 5 Å and about 200 Å. For example, BDEAS may be flown into the chamber for between about 0.1 seconds and about 60 seconds.

The oxygen containing precursor may be an ozone/oxygen mixture. For example, an ozone/oxygen mixture of between about 0.5% and about 10% by volume of ozone in oxygen may be introduced into the processing chamber at a flow rate of between about 100 sccm and about 20000 sccm. The ozone/oxygen mixture may be activated by contacting with a heated chamber surface, such as a chamber wall, gas distributor or showerhead, controlled at a temperature between about 70° C. and about 300° C., for example between about 100° C. and about 180° C. The chamber pressure may be between about 5 mTorr and about 100 Torr, and the temperature of a substrate support in the chamber may be between about 10° C. and about 100° C., for example between about 30° C. and about 80° C. while the ozone/oxygen gas is flown into the chamber.

Other suitable silicon containing precursor may be selected from the group consisting of octamethylcyclotetrasiloxane (OMCTS), methyldiethoxysilane (MDEOS), bis(tertiary-butylamino)silane (BTBAS), bis(diethylamino)silane (BDEAS), tris(dimethylamino)silane (TDMAS), bis(dimethylamino)silane (BDMAS), bis(ethyl-methylamino)silane (BEMAS), tetramethyl orthosilicate (TMOS), timethylsilane (TMS), tetraethyl orthosilicate (TEOS), and combinations thereof.

Other suitable oxygen containing precursor may be ozone mixed with active oxygen radicals generated by a remote plasma source. A remote plasma may be formed by providing oxygen gas to a remote plasma generator and coupling RF power between about 50 W and about 3,000 W, at a frequency of 13.56 MHz and/or 350 KHz, into the remote plasma generator.

In an alternate embodiment, an ALD process using active oxygen species and a silicon containing precursor may be used to form the silicon oxide layer for filling the patterned photoresist layer. In an ALD process, a silicon containing precursor is provided to the processing chamber and allowed to deposit on the surface of the substrate until all deposition sites are saturated. Then an active oxygen species is provided to the processing chamber to react with the silicon precursor deposited on the substrate surface to form a conformal silicon oxide layer. The chamber is then purged with a purge gas, substantially removing all oxygen containing species from the processing chamber. The layer formation cycle is repeated until a target thickness is reached. Suitable silicon containing precursor for the ALD processes may be selected from the group consisting of dichlorosilane (DCS), trichlorosilane (TCS), silicon tetrachloride, dibromosilane, silicon tetrabromide, BDEAS, OMCTS, trisilamine (TSA), silane, disilane, and combinations thereof.

Optionally, a descum process using oxygen reactive ion etching may be performed to the substrate having the patterned photoresist layer before depositing silicon oxide. The descum process removes particles or other contaminates from the surface of the substrate.

In box 130, a reactive ion etching process is used to etch back the silicon oxide layer until the patterned photoresist layer is exposed. A fluorine-containing plasma may be used to etch back the silicon oxide layer to expose the photoresist layer. For example, tetracarbon monofluoride ($CF_4$) gas is provided to a plasma chamber containing the substrate. The $CF_4$ gas is activated remotely or in situ by applying dissociate energy such as RF energy to generate a fluorine containing plasma. RF energy may be coupled into the $CF_4$ gas using an inductive plasma source. The fluorine containing plasma may etch back the silicon oxide layer without damaging the photoresist layer. Other materials, such as $BF_3$, and $S_xF_4$, may also be used to generate a fluorine containing plasma.

In box 140, a reactive ion etching process is used to remove the patterned photoresist layer forming a pattern in the silicon oxide layer over the hard mask layer. A plasma of oxidizing gas may be used to remove the photoresist layer without damaging the silicon oxide layer. Suitable oxidizing gas may be $O_2$, $O_3$, $NO_3$, CO, or $H_2O$.

In box 150, the pattern in the silicon oxide layer is copied to the hard mask layer underneath to expose portions of the magnetically susceptible layer for subsequent processing. A plasma of oxidizing gas may be used to remove the exposed hard mask layer without damaging the patterned silicon oxide and the magnetically susceptible layer. Suitable oxidizing gas may be $O_2$, $O_3$, $NO_3$, CO, or $H_2O$.

The removal of the photoresist layer in box 140 and the patterning of hard mask layer in box 150 may be performed in a single operation using the same plasma of oxidizing gas.

In box 160, energy is directed toward the surface of the substrate to modify magnetic properties of the magnetically susceptible layer in the unmasked zones. The energy may be delivered as ions, as neutral particles, or as radiation. The ions may be small ions with low atom count, such as less than about 10 atoms each, for example molecular ions, or the ions may be large ions having about 10 atoms each or more, for example macromolecular ions or cluster ions. The neutral particles may be neutralized species of any of the types of ions described above, or may be radical species. The radiation may be laser or electron beam radiation. Because the hard mask layer and the silicon oxide layer masking the magnetically susceptible layer have increased thickness and density than the photoresist pattern traditionally used, energetic species with increased average kinetic energy may be used to modify the magnetic properties of the substrate.

In box 170, the residual hard mask layer may be removed by a reactive ion etching process. A plasma of an oxidizing gas such as $O_2$, $O_3$, $NO_3$, CO, or $H_2O$ may be used to remove the residual hard mask layer without damaging the magnetically susceptible layer.

Embodiments of present invention as described above including novel techniques of using a silicon oxide layer as a patterned mask in place of a photoresist layer. Using a low temperature CVD process for filling a patterned surface and forming a planarized silicon oxide layer replaces the traditional spin-on techniques.

By using a silicon oxide as a mask to form a pattern on a hard mask layer, embodiments of the present invention provide several advantages over traditional patterning processes of magnetically susceptible layer. The silicon oxide and hard mask pattern formed according to embodiments of the present invention is more robust compared to the traditional photoresist pattern because the silicon oxide layer and hard mask layer are physically and chemically stronger than the traditional polymer photoresist in the processing environment. The hard mask pattern can also be made in increased thickness without the limitation of the photoresist imprinting process because a thicker mask can be made by depositing a thicker film for the hard mask layer. The increased thickness of the pattern reduces defects in the pattern and improves the quality of the magnetic media because a thicker mask is more likely to withstand the bombardment of ions during implantation processes.

Figure 2A:
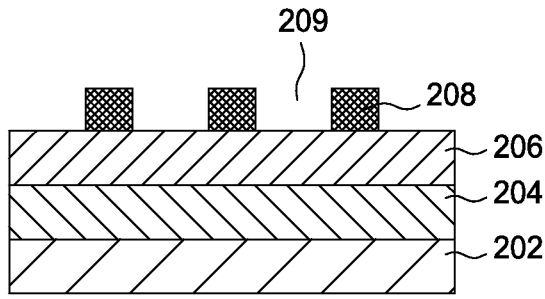
FIGS. 2A-2G are schematic side views of a substrate at various stages of the method of FIG. 1.

FIGS. 2A-2G are schematic side views of a substrate 202 at various stages of processing according to the method 100 of FIG. 1. In FIG. 2A, a magnetically susceptible layer 204 is formed on the substrate 202. A carbon hard mask layer 206 is formed over the magnetically susceptible layer 204. A patterned photoresist layer 208 is formed on the carbon hard mask layer 206. The pattern in the patterned photoresist layer 208 is a negative image of the pattern intended to use on the magnetically susceptible layer 204 as described with box 110 of the method 100 of FIG. 1. In the patterned photoresist layer 208, a plurality of vias 209 are formed by an imprinting process.

Figure 2B:
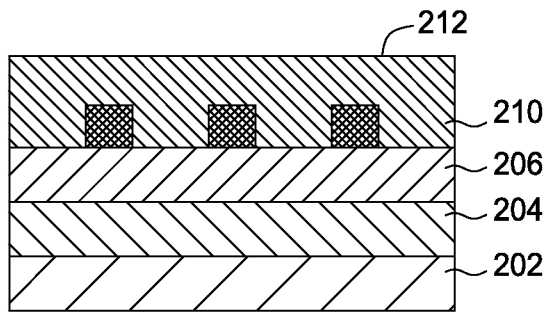

In FIG. 2B, a silicon oxide layer 210 is formed over the patterned photoresist layer 208 and fills the vias 209. The silicon oxide layer 210 may overfill the vias 209 so that the patterned photoresist layer 208 is under a top surface 212 of the silicon oxide layer 210. The silicon oxide layer 210 may be formed by a low temperature CVD process as described in box 120 of the method 100.

Figure 2C:
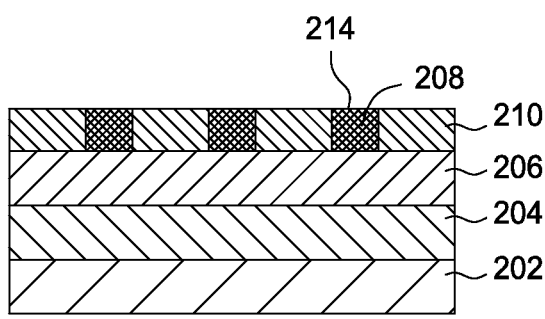

In FIG. 2C, the silicon oxide layer 210 is etched back until the patterned photoresist layer 208 is exposed. The etch back process may be performed by a reactive ion etching process as described in box 130 of the method 100. After the etch back, a top surface 214 may be substantially planar including portions of the photoresist layer 208 and portions of the silicon oxide layer 210.

Figure 2D:
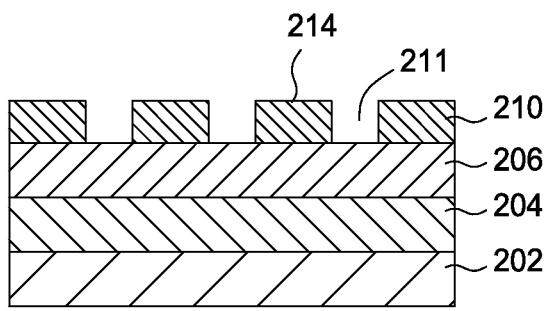

In FIG. 2D, the patterned photoresist layer 208 is removed to expose a portion of the hard mask layer 206. The patterned photoresist layer 208 may be removed by a reactive ion etching process as described in box 140 of the method 100. With the patterned photoresist layer 208 removed, a pattern having trenches 211 surrounding columns of silicon oxide is formed within the silicon oxide layer 210 over the hard mask layer 206. The pattern of the silicon oxide layer 210 is the same as the intended pattern for processing the magnetically susceptible layer 204.

Figure 2E:
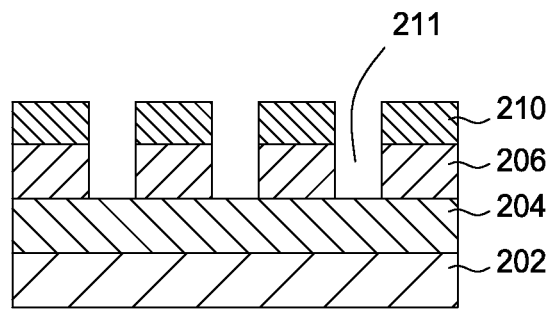

In FIG. 2E, the silicon oxide layer 210 is used to pattern the hard mask layer 206 by removing portions of the hard mask layer 206. The hard mask layer 206 may be removed by a reactive ion etching chemistry that does not damage the magnetically susceptible layer 204 and the silicon oxide layer 210 as described in box 150 of the method 100. The pattern in the silicon oxide layer 210 is copied to the hard mask layer 206. The trenches 211 are deepened until portions of the magnetically susceptible layer 204 to be processed are exposed. A pattern having the deepened trenches 211 surrounding columns of silicon oxide and hard mask material is formed.

Figure 2F:
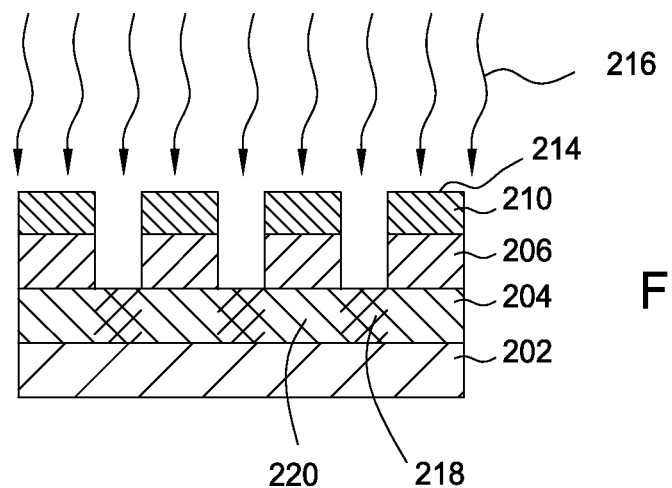

In FIG. 2F, energy 216 is directed towards the magnetically susceptible layer 204 to modify magnetic properties of the magnetically susceptible layer 204 in unmasked zones 218 that are not covered by the hard mask layer 206. The energy may be delivered by a plasma implantation process as described in box 160 of the method 100. The patterned hard mask layer 206 provides enhanced protection to masked zones 220 of the magnetically susceptible layer 204 while magnetic properties of the unmasked zones 218 are altered by the delivered energy 216.

Figure 2G:
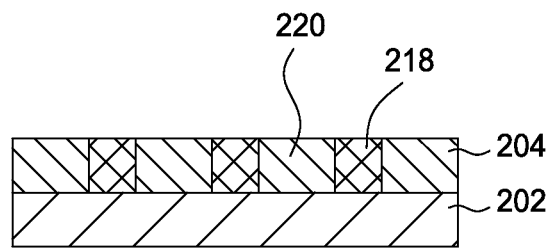

In FIG. 2G, residual of the hard mask layer 206 is stripped away by an etching process after the magnetic properties of the unmasked zones 218 are successfully altered. The hard mask layer 206 may be removed by the reactive ion etching process described in box 170 of the method 100. The magnetically susceptible layer 204 is now patterned with zones 218 that are not susceptible to a magnetic force surrounding zones 220 that are susceptible to a magnetic force.

Figure 3:
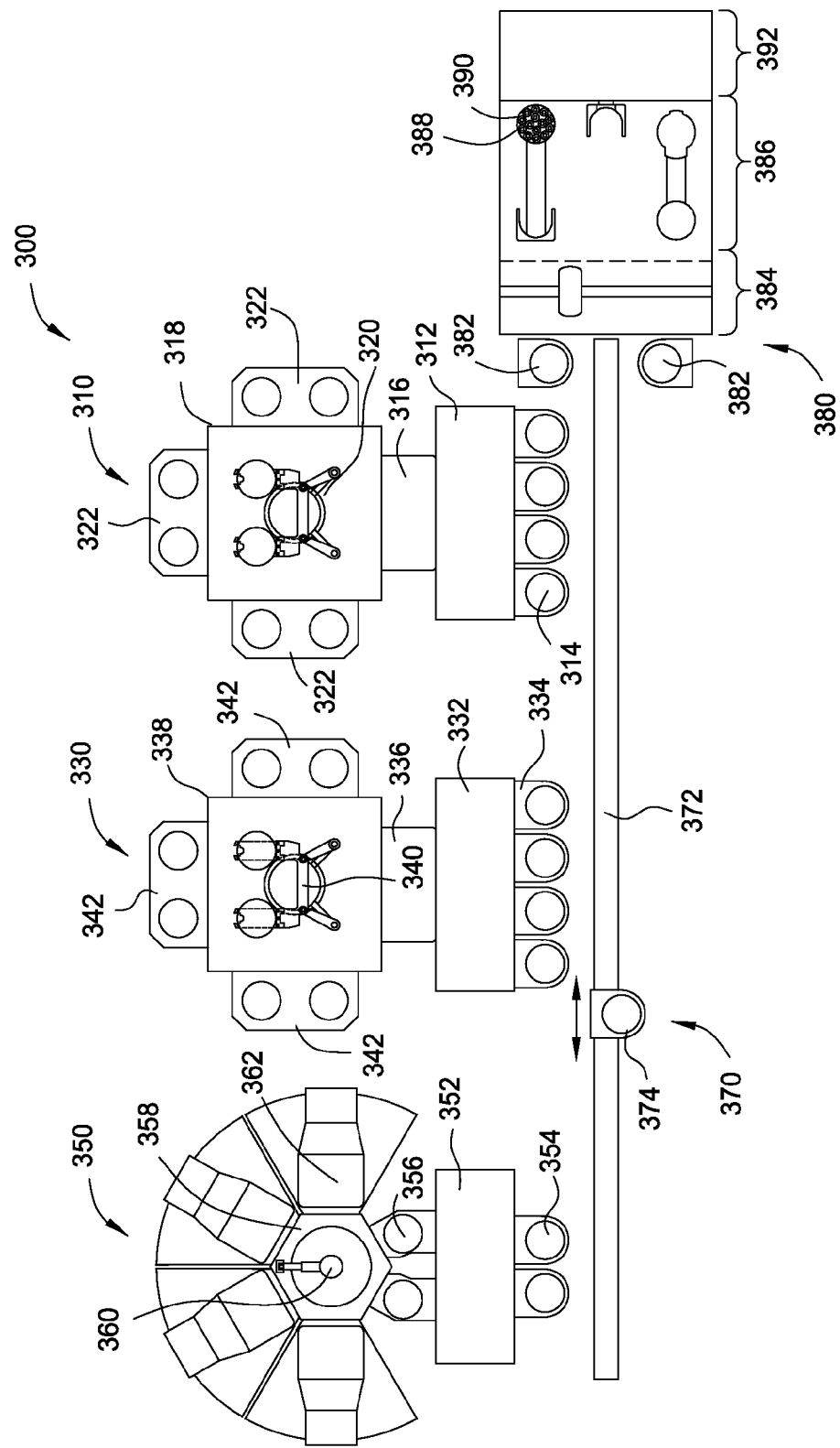
FIG. 3 is a plan view of a system layout according to one embodiment of the present invention.

FIG. 3 is a plan view of a system layout 300 according to one embodiment of the present invention. The system layout 300 may be used to perform the process of patterning a magnetically susceptible layer for magnetic media as described in FIGS. 1 and 2.

The system layout 300 includes a CVD tool 310, an etch tool 330, an implant tool 350, a substrate flipping tool 380, and a track assembly 370 configured to transferring substrates or cassettes of substrates among the CVD tool 310, the etching tool 330, and the implantation tool 350 and the substrate flipping tool 380.

The CVD tool 310 includes a factory interface 312 connected between one or more front opening universal pods (FOUPs) 314 and a load lock chamber 316. The CVD tool 310 also includes a transfer chamber 318 connected to a plurality of CVD chambers 322 and the load lock chamber 316. The CVD chambers 322 are configured to deposit a silicon oxide layer by a low temperature CVD process as described in box 120 of the method 100. A substrate transfer robot 320 is disposed in the transfer chamber 318 for transferring substrates or carriers of substrates among the load lock chamber 316 and the CVD chambers 322. Each of the CVD chambers 322 may include dual processing volumes configured to simultaneously processing two set of substrates. The substrate transfer robot 320 may be configured to transfer two substrates/substrate carriers simultaneously. One example of the CVD chamber 322 may be available with PRODUCER® PECVD chamber from Applied Materials, Inc., of Santa Clara, Calif. One example of the CVD tool 310 may be available with PRODUCER® GT platform also from Applied Materials, Inc., of Santa Clara, Calif.

The etch tool 330 includes a factory interface 332 connected between one or more FOUPs 334 and a load lock chamber 336. The etch tool 330 also includes a transfer chamber 338 connected to a plurality of etch chambers 342 and the load lock chamber 336. Each of the etch chambers 342 is configured to perform one or more reactive ion etching processes, for example, the silicon oxide etch back process as described in box 130, the photoresist etch process as described in box 140, the hard mask etch process as described in box 150 and the residual hard mask etch process as described in box 170 of the method 100. A substrate transfer robot 340 is disposed in the transfer chamber 338 for transferring substrates or carriers of substrates among the load lock chamber 336 and the etch chambers 342. Each of the etch chambers 342 may include dual processing volumes configured to simultaneously processing two set of substrates. The substrate transfer robot 340 may be configured to transfer two substrates/substrate carriers simultaneously. One example of the etch chamber 342 may be available with PRODUCER® ETCH chamber from Applied Materials, Inc., of Santa Clara, Calif. One example of the etch tool 330 may be available with PRODUCER® GT platform also from Applied Materials, Inc., of Santa Clara, Calif.

The implant tool 350 includes a factory interface 352 connected between one or more FOUPs 354 and load lock chambers 356. The load lock chambers 356 are further connected to a transfer chamber 358 coupled to a plurality of plasma ion immersion implantation chambers 362. A substrate transfer robot 360 is disposed in the transfer chamber 358 for transferring substrates/carriers among the load lock chambers 356 and the plasma ion immersion implantation chambers 362. Each of the plasma ion immersion implantation chambers 362 is configured to perform an implantation process as described in box 160 of the method 100. One example of the implant chamber 362 may be available with CENTURA® ACP chamber from Applied Materials, Inc., of Santa Clara, Calif. One example of the implant tool 350 may be available with CENTURA® platform also from Applied Materials, Inc., of Santa Clara, Calif.

The substrate flipping tool 380 is configured to flip substrates for magnetic media for forming magnetic patterning on both sides of the substrates. Substrates 388 for magnetic media are generally a circular disk having a center hole. During processing, the substrates 388 are transferred in substrate carriers 390 having multiple slots for receiving the substrates 388. The substrate flipping tool 380 includes a loader module 384 connecting one or more FOUPs 382 and a carrier handling module 386. The substrate flipping tool 380 also includes a substrate handling module 392. The loader module 384 transfers a plurality of substrate carriers 390 between the carrier handling module 386 and the one or more FOUPs 382. The substrate handling module 392 picks up substrates 388 from a carrier 390, flipping the substrates 388 and placing the substrates 388 on a carrier 390 with opposing sides facing up. A detailed description of an exemplary substrate flipping tool may be found in U.S. patent application Ser. No. 12/984,528, filed Jan. 4, 2011, and published as 2011/0163065, which is incorporated herein by reference.

The track assembly 370 includes a track 372 and a cassette transfer robot 374 moving along the track 372. The cassette transfer robot 374 is configured to transfer cassettes of substrate carriers among the FOUPs 314, 334, 354 and 382 of the system layout 300. The track 372 may be linear or other shape depending on the arrangement of the CVD tool 310, the etch tool 330, the implant tool 350 and the substrate flipping tool 380.

During processing, a plurality of substrates 388 positioned on substrate carriers 390 is first loaded into the CVD tool 310 by the cassette transfer robot 374. The substrates 388 have a patterned photoresist layer formed on a hard mask layer and a magnetically susceptible layer as shown in FIG. 2A. A silicon oxide layer is formed over the substrates 388 in the CVD chambers 322 by a low temperature CVD process as described in box 120.

After formation of the silicon oxide layer, the plurality of substrates 388 are transferred on carriers 390 in cassettes to the etch tool 330. In the etch tool 330, the silicon oxide layer is etched back to exposed the patterned photoresist layer as described in box 130, the photoresist layer is then removed by an etch process as described in box 140, and the hard mask layer is etched using the silicon oxide layer as a photoresist as described in box 150. The etch processes may be performed in different etch chambers 342 or in the same etch chambers 342.

The substrates 388 are then transferred from the etch tool 330 to the implant tool 350. The unmasked magnetically susceptible layer is altered by ion implantation performed in the plasma ion immersion implantations chambers 362 as described in box 160.

After the implantation, the substrates 388 are transferred back to the etch tool 330 to remove residual of the hard mask layer. The residual hard mask layer may be removed by a process as described in box 170 by one of the etch chambers 322. This concludes patterning of the magnetic susceptible layer on one side of the substrates 388.

The substrates 388 are then transferred to the substrate flipping tool 380. The substrates 388 are flipped to have non-processed sides facing up and returned to the CVD tool 310 to repeat the patterning process.

Figure 4:
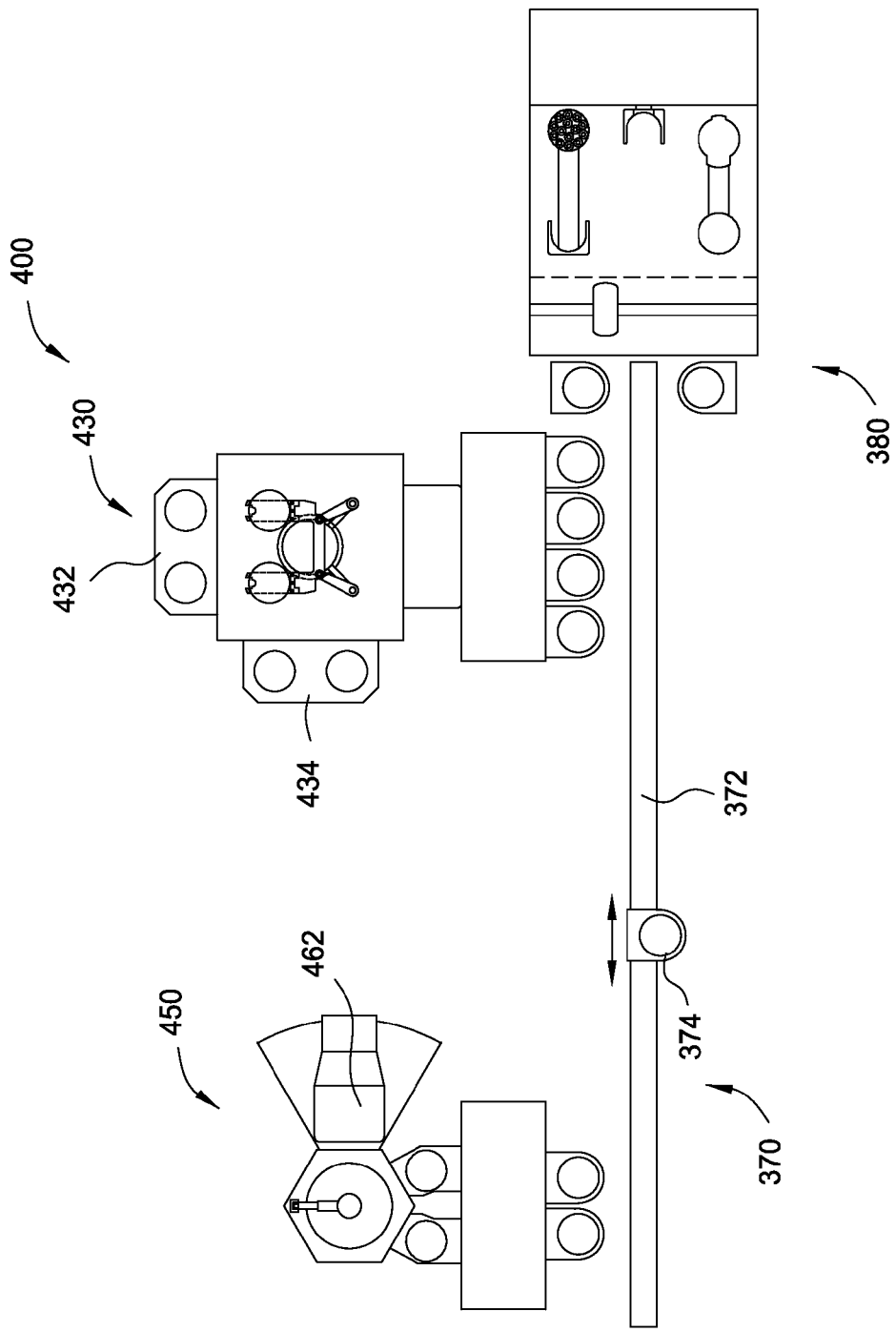
FIG. 4 is a plan view of a system layout according to another embodiment of the present invention.

FIG. 4 is a plan view of a system layout 400 according to another embodiment of the present invention. The system layout 400 may be used to perform the process of patterning a magnetically susceptible layer for magnetic media as described in FIGS. 1 and 2. Compared to the system layout 300, the system layout 400 is a low cost assembly with fewer tools and chambers and occupying smaller space in the clean room. The system layout 400 includes the substrate flipping tool 380, and the track assembly 370 as in the system layout 300. The system layout 400 also a CVD/etch tool 430 and an implant tool 450.

The CVD/etch tool 430 is similar to the CVD tool 310 except that the CVD/etch tool 430 includes a CVD chamber 432 and an etch chamber 434. The implant tool 450 is similar to the implant tool 350 except the implant tool 450 includes only one plasma ion immersion implantation chamber 462.

During processing, a plurality of substrates 388 positioned on substrate carriers 390 is first loaded into the CVD/etch tool 430 by the cassette transfer robot 374. A silicon oxide layer is formed over the substrates 388 in the CVD chamber 432 by a low temperature CVD process as described in box 120. The silicon oxide layer is etched back to exposed the patterned photoresist layer as described in box 130, the photoresist layer is then removed by an etch process as described in box 140, and the hard mask layer is etched using the silicon oxide layer as a photoresist as described in box 150. The etch processes are performed in the etch chambers 434. The substrates 388 are then transferred from the CVD/etch tool 430 to the implant tool 450. The unmasked magnetically susceptible layer is altered by ion implantation performed in the plasma ion immersion implantations chamber 462 as described in box 160. After the implantation, the substrates 388 are transferred back to the CVD/etch tool 430 to remove residual of the hard mask layer in the etch chamber 434. The substrates 388 are then transferred to the substrate flipping tool 380 to have the opposite side facing up and returned to the CVD/etch tool 430 to repeat the patterning process.

While the foregoing is directed to embodiments of the present invention, other and further embodiments of the invention may be devised without departing from the basic scope thereof, and the scope thereof is determined by the claims that follow.

The invention claimed is:

1. A method for forming a patterned magnetic layer, comprising:
    forming a pattern in a hard mask layer deposited over a magnetically susceptible layer on a substrate, wherein forming a pattern in the hard mask layer comprises:
        forming the pattern with a silicon oxide layer over the hard mask layer, wherein forming the pattern with a silicon oxide layer comprises:
            forming a reverse pattern in a photoresist layer over the hard mask layer;
            filling the reverse pattern in the photoresist layer with silicon oxide and by forming the silicon oxide layer;
            etching back the silicon oxide layer to reveal the photoresist layer; and
            removing the photoresist layer to form the pattern with the silicon oxide layer: and
        etching the hard mask layer using the pattern of the silicon oxide layer; and
    directing energy towards the substrate to modify a magnetic property of the magnetically susceptible layer to form a patterned magnetic layer.

2. The method of claim 1, wherein forming the silicon oxide layer comprises depositing the silicon oxide layer by performing a chemical vapor deposition process.

3. The method of claim 2, wherein the chemical vapor deposition process is performed at a temperature lower than about 150° C.

4. The method of claim 3, wherein the temperature is between about 20° C. to about 100° C.

5. The method of claim 4, wherein the temperature is between about 30° C. to about 80° C.

6. The method of claim 2, wherein performing the chemical vapor deposition process comprises:
    flowing a silicon containing precursor to deposit a conformal silicon containing half-layer; and
    flowing a reactive oxygen containing gas to react with the conformal silicon containing half-layer.

7. The method of claim 6, wherein the silicon containing precursor comprises bis(diethylamino)silane (BDEAS), and the oxygen containing gas comprises an ozone and oxygen mixture.

8. The method of claim 1, wherein etching back the silicon oxide layer comprises performing a reactive ion etching using a fluorine containing plasma.

9. The method of claim 1, wherein removing the photoresist layer comprises performing a reactive ion etching using plasma of an oxidizing gas.

10. The method of claim 1, further comprising removing the hard mask layer by performing a reactive ion etching process using plasma of an oxidizing gas.

11. A method for forming a patterned magnetic layer, comprising:
 providing a plurality of substrates having a patterned photoresist layer over a hard mask layer, wherein the hard mask layer is over a magnetically susceptible layer;
 depositing a silicon oxide layer by chemical vapor deposition over the patterned photoresist layer to fill vias within the patterned photoresist layer;
 etching back the silicon oxide layer to reveal the photoresist layer;
 removing the photoresist layer to form a pattern of the silicon oxide layer;
 etching the hard mask layer using the pattern of the silicon oxide layer; and
 directing energy towards the substrate to modify a magnetic property of the magnetically susceptible layer to form the patterned magnetic layer.

12. The method of claim 11, wherein depositing the silicon oxide layer comprises:
 flowing a silicon containing precursor to deposit a conformal silicon containing half-layer; and
 flowing a reactive oxygen containing gas to react with the conformal silicon containing half-layer.

13. The method of claim 12, wherein the silicon containing precursor comprises bis(diethylamino)silane (BDEAS), and the oxygen containing gas comprises an ozone and oxygen mixture.

14. The method of claim 12, wherein depositing the silicon oxide layer is performed at a temperature lower than about 150° C.

15. The method of claim 11, wherein etching back the silicon oxide layer comprises performing a reactive ion etching using a fluorine containing plasma.

16. A method for forming a patterned magnetic layer, comprising:
 forming a hard mask layer over a magnetically susceptible layer of a substrate;
 forming a photoresist layer over the hard mask layer;
 forming a reverse pattern in the photoresist layer;
 filling the reverse pattern in the photoresist layer with a silicon oxide layer;
 removing the photoresist layer to form a pattern in the silicon oxide layer;
 etching the hard mask layer using the pattern in the silicon oxide layer; and
 directing energy towards the substrate to modify a magnetic property of the magnetically susceptible layer to form a patterned magnetic layer.

17. The method of claim 16, further comprising:
 overfilling the reversed pattern in the photoresist layer with the silicon oxide layer; and
 etching back the silicon oxide layer to reveal the photoresist layer.

18. The method of claim 16, wherein filling the reversed pattern comprises depositing the silicon oxide layer by performing a chemical vapor deposition process.

19. The method of claim 18, wherein performing the chemical vapor deposition process comprises:
 flowing a silicon containing precursor to deposit a conformal silicon containing half-layer; and
 flowing a reactive oxygen containing gas to react with the conformal silicon containing half-layer.

20. The method of claim 19, wherein the silicon containing precursor comprises bis(diethylamino)silane (BDEAS), and the oxygen containing gas comprises an ozone and oxygen mixture.

\* \* \* \* \*

UNITED STATES PATENT AND TRADEMARK OFFICE
CERTIFICATE OF CORRECTION

PATENT NO. : 8,852,962 B2  
APPLICATION NO. : 13/659555  
DATED : October 7, 2014  
INVENTOR(S) : Verhaverbeke et al.

Page 1 of 1

It is certified that error appears in the above-identified patent and that said Letters Patent is hereby corrected as shown below:

In Claims:

Column 10, Claims 1, Line 28 delete "and".

Signed and Sealed this  
Thirty-first Day of March, 2015

Michelle K. Lee  
*Director of the United States Patent and Trademark Office*